United States Patent
Manouvrier et al.

(10) Patent No.: US 9,423,580 B2
(45) Date of Patent: Aug. 23, 2016

(54) DYNAMIC ESD PROTECTION DEVICE ADAPTED TO ELECTRO-OPTICAL DEVICES

(71) Applicants: STMICROELECTRONICS SA, Montrouge (FR); STMICROELECTRONICS (CROLLES 2) SAS, Crolles (FR)

(72) Inventors: Jean-Robert Manouvrier, Echirolles (FR); Estelle Batail, Grenoble (FR)

(73) Assignees: STMICROELECTRONICS SA, Montrouge (FR); STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 14/637,559

(22) Filed: Mar. 4, 2015

(65) Prior Publication Data
US 2015/0253523 A1    Sep. 10, 2015

(30) Foreign Application Priority Data

Mar. 10, 2014  (FR) ..................................... 14 51960

(51) Int. Cl.
| | | |
|---|---|---|
| *G02F 1/01* | (2006.01) | |
| *G02F 1/035* | (2006.01) | |
| *G02F 1/295* | (2006.01) | |
| *G02B 6/12* | (2006.01) | |

(Continued)

(52) U.S. Cl.
CPC ............... G02B 6/4275 (2013.01); G02B 6/13 (2013.01); G02F 1/025 (2013.01); H01L 21/768 (2013.01); H01L 27/0248 (2013.01); H01L 28/40 (2013.01); *G02F 2202/22* (2013.01)

(58) Field of Classification Search
CPC ............ G02F 1/025; G02B 6/12; G02B 6/13; G02B 6/4275; H01L 21/768; H01L 27/0248; H01L 27/0259; H01L 27/0292
USPC .................................. 385/1–3, 8, 14, 129–131
See application file for complete search history.

(56) References Cited

U.S. PATENT DOCUMENTS

| 4,400,711 A * | 8/1983 | Avery ................. H01L 27/0248 257/109 |
| 2002/0072178 A1 * | 6/2002 | Cai ..................... H01L 27/0266 438/289 |

(Continued)

FOREIGN PATENT DOCUMENTS

| JP | 2010287604 A | 12/2010 |
| WO | 2008105854 A1 | 9/2008 |
| WO | 2010109134 A1 | 9/2010 |

OTHER PUBLICATIONS

De Debbelaere, "Silicon Photonics Technology Platform for Embedded and Integrated Optical Interconnect Systems," Design Automation Conference, IEEE, Jan. 22, 2013, pp. 644-647.

*Primary Examiner* — Kaveh C Kianni
*Assistant Examiner* — Hung Lam
(74) *Attorney, Agent, or Firm* — Allen, Dyer, Doppelt, Milbrath & Gilchrist, P.A.

(57) ABSTRACT

An ESD protection device for an electro-optical device may include an optical waveguide segment being in semiconductor material and including a central zone of a first conductivity type, and first and second wings of a second conductivity type different from the first conductivity type and being integral with the central zone. The ESD protection device may include a first conduction terminal on the first wing for defining a first protection terminal, a second conduction terminal on the second wing for defining a second protection terminal, and a resistive contact structure of the first conductivity type having a transverse arm integral with the central zone, and an end in ohmic contact with the first conduction terminal, the resistive contact structure being electrically insulated from the first wing.

20 Claims, 3 Drawing Sheets

(51) Int. Cl.
*G02B 6/10* (2006.01)
*G02B 6/42* (2006.01)
*G02B 6/13* (2006.01)
*H01L 21/768* (2006.01)
*H01L 49/02* (2006.01)
*G02F 1/025* (2006.01)
*H01L 27/02* (2006.01)

(56) References Cited

U.S. PATENT DOCUMENTS

2007/0007545 A1* 1/2007 Salcedo ............... H01L 29/87
                                                              257/127
2010/0171149 A1* 7/2010 Denison ............. H01L 29/7436
                                                              257/173

* cited by examiner

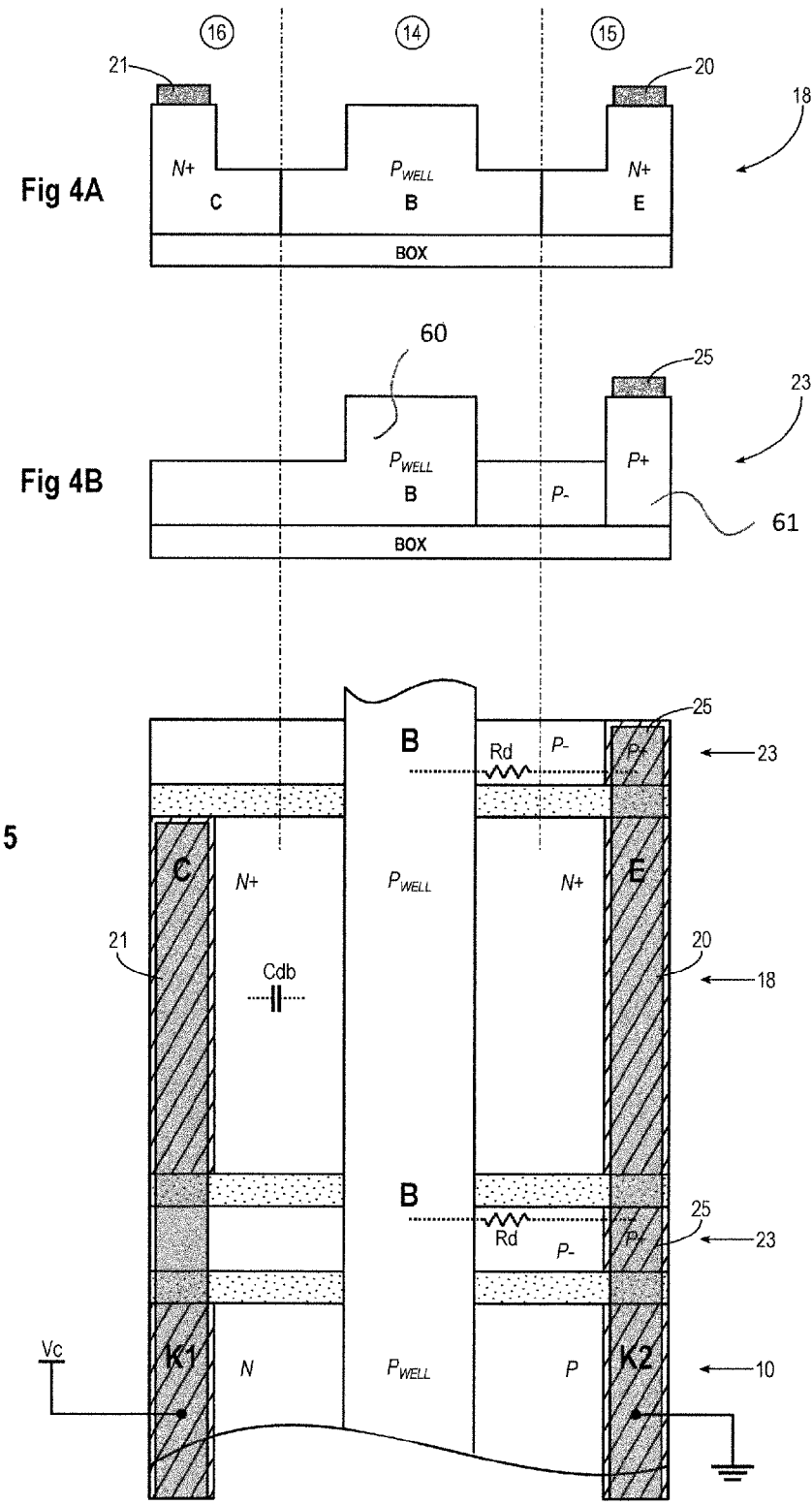

US 9,423,580 B2

DYNAMIC ESD PROTECTION DEVICE ADAPTED TO ELECTRO-OPTICAL DEVICES

TECHNICAL FIELD

The present disclosure relates to devices for protecting electronic components against electrostatic discharge (ESD), and more particularly, to a dynamic protection device for electro-optical components.

BACKGROUND

FIG. 1A is a circuit diagram of a conventional grounded-gate N-channel metal-oxide-semiconductor field-effect transistor (ggNMOS) protection device, commonly used in complementary metal-oxide-semiconductor (CMOS) technology. It comprises an NMOS transistor whose source and gate are connected to the ground. The substrate of the transistor, typically common to all transistors of the circuit, is also connected to ground. The drain of the transistor forms a hot terminal H of the protection device, the cold terminal being the ground. The device 10 generally comprises a terminal connected to ground and one or more terminals sensitive to electrostatic discharge. Each of these sensitive terminals may be connected to a terminal H of a dedicated protection device.

FIG. 1B shows a ggNMOS device. The operation of the device is determined by the parasitic NPN bipolar transistor of the MOS transistor. This bipolar transistor Q has its emitter connected to ground and its collector connected to the terminal H. The base of transistor Q is formed by the substrate of the MOS transistor. The area of the substrate useful to the transistor Q is at a given distance from an ohmic contact connecting the substrate to ground, so that there is a resistance Rd, referred to as "depolarization resistance," between the base of transistor Q and ground. Moreover, the base and collector are connected through a capacitor Cdb representing the drain-substrate capacitance of the MOS transistor.

This type of protection device has two operating modes, a static mode and a dynamic mode. In static mode, when the voltage on terminal H is sufficiently high, the collector-base junction of transistor Q assumes an avalanche state. The base-emitter voltage exceeds the junction threshold and the transistor becomes conductive, short-circuiting (i.e. shorting) the terminal H to ground. In dynamic mode, when the voltage on terminal H increases fast enough, the capacitor Cdb has no time to charge through resistor Rd. The base-emitter voltage reproduces the transition of the voltage at terminal H, such that the junction threshold is exceeded and the transistor turns on to counter the phenomenon.

This type of protection device is used with CMOS technology, since it is designed from a MOS transistor without violating the available design rules and without requiring the creation of a dedicated component. The values of capacitor Cdb and resistance Rd are moreover controllable to adjust the desired dynamic characteristics.

Electro-optical components made of semiconductor materials may also require protection against electrostatic discharge. Optical and electro-optical components that are integrated together are simple compared to components that are integrated with CMOS technology, whereby dedicated manufacturing techniques have been developed for optical components that are inexpensive compared to CMOS technologies.

SUMMARY

Generally speaking, an ESD protection device for an electro-optical device may include an optical waveguide segment being in semiconductor material and comprising a central zone of a first conductivity type, and first and second wings of a second conductivity type different from the first conductivity type and being integral with the central zone. The ESD protection device may include a first conduction terminal on the first wing for defining a first protection terminal, a second conduction terminal on the second wing for defining a second protection terminal, and a resistive contact structure of the first conductivity type having a transverse arm integral with the central zone, and an end in ohmic contact with the first conduction terminal, the resistive contact structure being electrically insulated from the first wing.

BRIEF DESCRIPTION OF THE DRAWINGS

FIGS. 4A and 4B are schematic diagrams of a cross-sectional view along distinct planes of an embodiment of an electrostatic discharge protection device adapted to an electro-optical component, according to the present disclosure.

FIG. 5 is a schematic diagram of a top plan view of the device of FIGS. 4A and 4B.

DETAILED DESCRIPTION

The techniques dedicated to optical components offer little flexibility for realizing protection devices. In particular, they do not offer the possibility to realize ggNMOS-type protection devices. A device for protecting an electro-optical component against electrostatic discharge, as provided herein, generally comprises an optical waveguide segment in a semiconductor material, formed of a central longitudinal zone of a first conductivity type, and first and second wings of a second conductivity type integral with the central zone. The device includes an emitter terminal on the first wing, forming a first protection terminal, a collector terminal on the second wing, forming a second protection terminal, and a resistive contact structure of the first conductivity type. The contact structure includes a transverse arm integral with the central zone and an end in ohmic contact with the emitter terminal, the contact structure being electrically isolated from the first wing.

The transverse arm may be connected by a distal end to the emitter terminal through a longitudinal conductive track. The contact structure may be L-shaped and comprise a longitudinal arm having an end connected to the emitter terminal through a transverse conductive track.

The device may comprise two contact structures symmetrical relative to a transverse axis of the first wing. The device may comprise a capacitive structure of the first conductivity type having a transverse arm integral with the central zone and a longitudinal arm parallel to a face of the second wing.

An optical waveguide in a semiconductor material may comprise a central longitudinal zone configured to convey an optical wave, and first and second wings integral with the central zone. The optical waveguide may include an electro-optical component arranged in a first segment of the waveguide bearing a control terminal on each wing, a protection device as mentioned above, arranged in a second segment of the waveguide, and longitudinal conductor tracks connecting the control terminals of the electro-optical component respectively to the emitter and collector terminals of the protection device.

Figure 2:
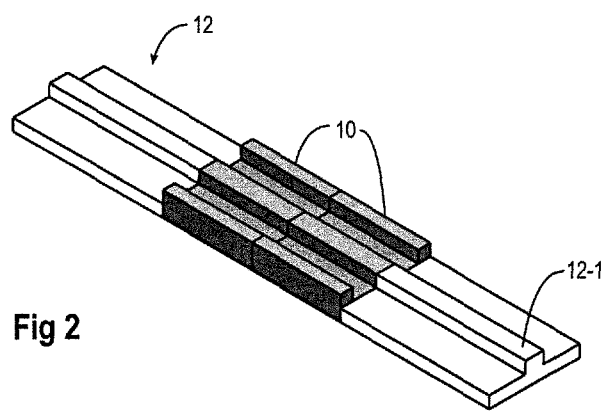
FIG. 2 is a schematic diagram of a perspective view of an optical waveguide integrating electro-optical components, according to the present disclosure.

FIG. 2 is a perspective view of a length of an optical waveguide 12 comprising two electro-optical components 10. The components 10 are, for example, a static phase shifter and a dynamic phase shifter. The waveguide is in the form of a flat profile of a monolithic semiconductor material that is preferably intrinsic or lightly doped to reduce optical losses.

As shown, the waveguide 12 may be a rib waveguide (i.e. rib-shaped), comprising a raised central portion 12-1 forming the rib and two lateral wings on either side of the rib. Most of the optical power of the waveguide is then transported in the vicinity of the rib. In silicon on insulator (SOI) technology, the waveguide has a typical height of 300 nm.

The components 10 are configured to replace waveguide segments; they can be formed from the waveguide itself through etching and doping steps. Thus, the components 10 have substantially the same profile as the waveguide assembly, in particular in the center for maintaining uniform optical wave guiding characteristics. The wings of the waveguide at the level of the components 10 may bear contact terminals for using the components. These terminals are generally formed on raised edges of the wings, reaching levels of metal, as shown.

Figure 3:
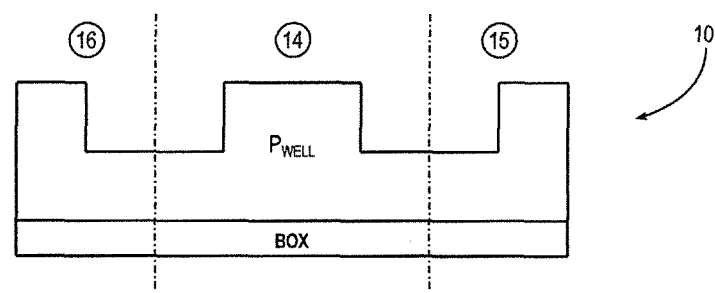
FIG. 3 is a schematic diagram of a cross-sectional view of an electro-optical component, according to the present disclosure.

FIG. 3 shows a generic electro-optical component 10. The cross-section plane is perpendicular to the axis of the optical waveguide 12. The component comprises a central portion 14 and two lateral portions 15 and 16 on both sides. The central portion 14 conforms to the profile of the waveguide and is often of P conductivity type. The doping level may be as low as possible to reduce optical losses while providing the desired function. The doping level of the original substrate (PWELL) may be used, for example.

An electro-optical component is often a diode that may have various configurations and uses. For this purpose, one of the zones 15, 16 is of P conductivity type while the other is N conductivity type to form a PN junction in the central zone 14. Typically, doping levels increase from the center to the edges, which limit the optical losses in the center while reducing the resistivity of the component to improve its electrical characteristics. The waveguide and the components may be realized on an insulating substrate, e.g. buried oxide BOX.

The PN junctions thus created in this type of component may be damaged by electrostatic discharges (ESD) reaching the reverse breakdown voltage of the junctions. So it is desirable to protect these components from ESD. Hereinafter, embodiments of protection devices for electro-optical components are provided, which do not require modification of existing manufacturing techniques of the electro-optical components.

FIG. 4A is a schematic cross-section view, along a plane perpendicular to the waveguide, of a bipolar transistor 18 formed in the footprint of a conventional electro-optical component, i.e. in a waveguide segment of the type of FIG. 3, having three portions 14, 15, and 16.

The central portion 14 is of the P conductivity type, for example, preferably with a low doping level (PWELL) to limit the optical losses. The two wings 15 and 16 are of the N conductivity type, preferably with a high doping level (N+) to reduce the resistivity of the transistor and increase its gain. An NPN transistor is thus realized, the emitter E, base B and collector C of which are formed by the zones 15, 14 and 16 of the structure. This transistor may be used to replicate the functionality of a ggNMOS device using its equivalent circuit of FIG. 1B.

Access to the emitter E and to the collector C may be achieved through ohmic contacts 20, 21 made on the raised edges of the wings. One difficulty is to provide access to the base B of the transistor. Indeed, it is not desirable to provide ohmic contacts and conductive tracks on the central portion 14, because these would affect the optical properties of the waveguide.

FIG. 4B is a schematic cross-section view of a contact structure 23 providing access to the base B of the NPN transistor. The section is along a plane parallel to that of FIG. 4A, offset along the axis of the waveguide. This structure is also achieved in a footprint of an electro-optical component, and is adjacent to the structure of FIG. 4A.

The central area 60 is an extension of the central zone 14 of FIG. 4A. The entire structure is of the same conductivity type (P) as the central zone. The edge 61 of the right wing 15 is raised and provides access to the base B of the transistor through an ohmic contact 25. To improve electrical contact, the area plumb with the contact 25 may have a high doping level (P+). The left wing 16 may correspond to the original wing of the waveguide.

Figure 1A:
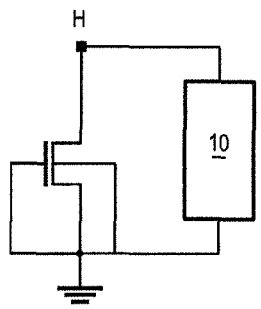
FIGS. 1A and 1B are schematic circuit diagrams of a ggNMOS protection device and an equivalent circuit diagram, respectively, according to the prior art.
Figure 1B:
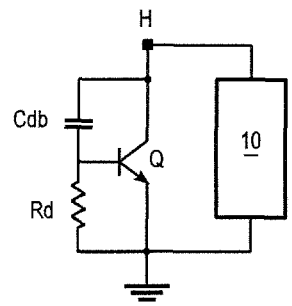

In fact, to achieve the structure of FIG. 1B, it is desired to connect the base B to ground through a depolarization resistor Rd. Assuming that the contact 25 is connected to ground with the emitter contact 20, the resistance Rd can be realized by adjusting the resistivity of the wing 15. This resistivity depends on the section of the wing, its length (in the transverse direction of the waveguide), and the doping level. The doping level of the wing between the central area and the edge is designated by P−, corresponding to a level lower than the doping level PWELL of the central portion.

FIG. 5 is a top view showing one possible arrangement of structures 18 and 23 in a waveguide for protecting an exemplary component 10. The raised areas of the structures are represented by hatching (except for the central zone). The component 10 may be a high-speed phase shifter (HSPM), which is in the form of a PN junction located in the central area and designed to be reverse biased by a control voltage Vc. The left wing 16 of the component 10 is of N conductivity type and is accessed via a terminal K1 to which is applied voltage Vc. The right wing 15 of the component is of P conductivity type and is accessible via a terminal K2, connected to ground, for example.

The protection device comprises the NPN transistor structure 18 and here two contact structures 23 located at both ends of the structure 18. The transistor structure 18 may be relatively long, so that the access to the central base zone B through its two ends provides a better distribution of the base current and improves the characteristics of the transistor.

The terminals 25 of the structures 23, the emitter terminal 20 of the structure 18, and the terminal K2 of the component 10 are aligned and connected through a longitudinal conductive track, shown in gray. This track, as well as its connection to ground, may be realized in the metal levels provided by the manufacturing technology. On the other side of the waveguide, the collector terminal 21 of the structure 18 and the terminal K1 of the component 10 are connected through a second longitudinal conductive track that receives the control voltage Vc.

The contact structures 23 may be relatively short to increase the value of the resistor Rd, if desired. The structures 23 are preferably separated from the structure 18 by isolation regions formed, for example, by the original material of the waveguide, intrinsic silicon or having the lowest achievable doping level, denoted P–. A similar isolation region may be provided between the component 10 and the protection device. Alternatively, the distal portions of the isolation regions may be replaced by silicon oxide, the central portion remaining of silicon to not affect the propagation of the optical wave. The capacitor Cdb of FIG. 1B is formed by the collector-base junction capacitance of the structure 18, and its value depends on the surface of the junction.

In some applications, it may be desirable to increase the adjustment margins for the triggering of the protection device. If the configuration of FIG. 5 does not allow a sufficiently fast triggering, because the capacitance Cdb or the resistance Rd cannot be made sufficiently high within reasonable size limits, embodiments described below may be used.

Figure 6:
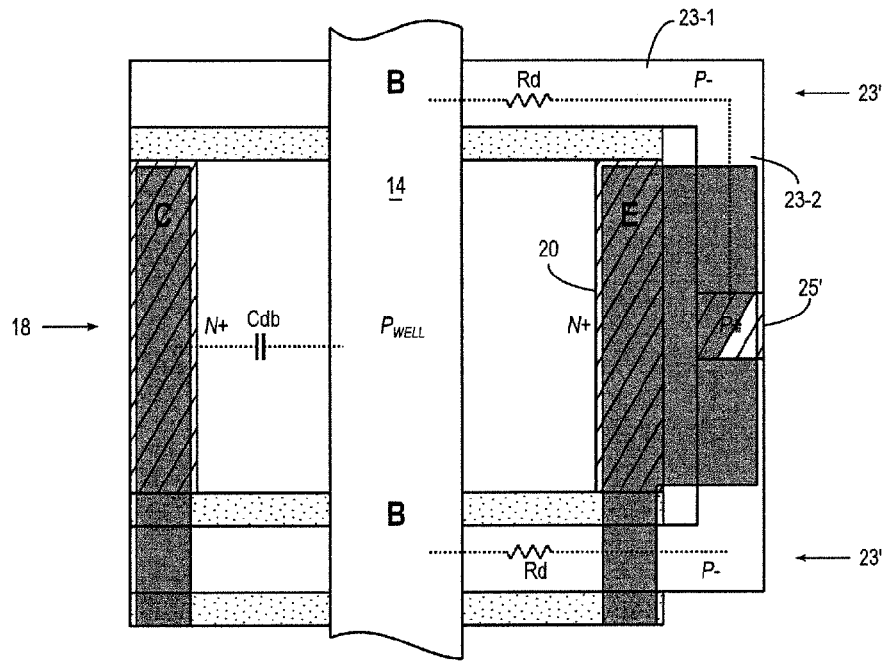
FIG. 6 is a schematic diagram of a top plan view of another embodiment of the protection device, according to the present disclosure.

FIG. 6 is a top view of an embodiment of a protection device that allows for increasing the value of the resistor Rd. The contact structure, here designated by 23', has an "L" shape. It comprises a transverse arm 23-1 integral with the central zone 14 and a longitudinal arm 23-2 joining an elevated ohmic contact zone 25' arranged behind the right face of the waveguide, for example, at mid-length of the transistor structure 18. Two structures 23' may be provided, as shown, symmetrical relative to a transverse axis of the transistor structure 18. The contact 25' is connected to the emitter contact 20 by a transverse conductive track. This track is shown (in gray) in the form of a rectangle which covers the contact 25' and the emitter contact 20 over the entire length of the structure 18. The value of the resistor Rd may be further increased by providing a meander structure between each transverse arm 23-1 and the contact 25'.

Figure 7:
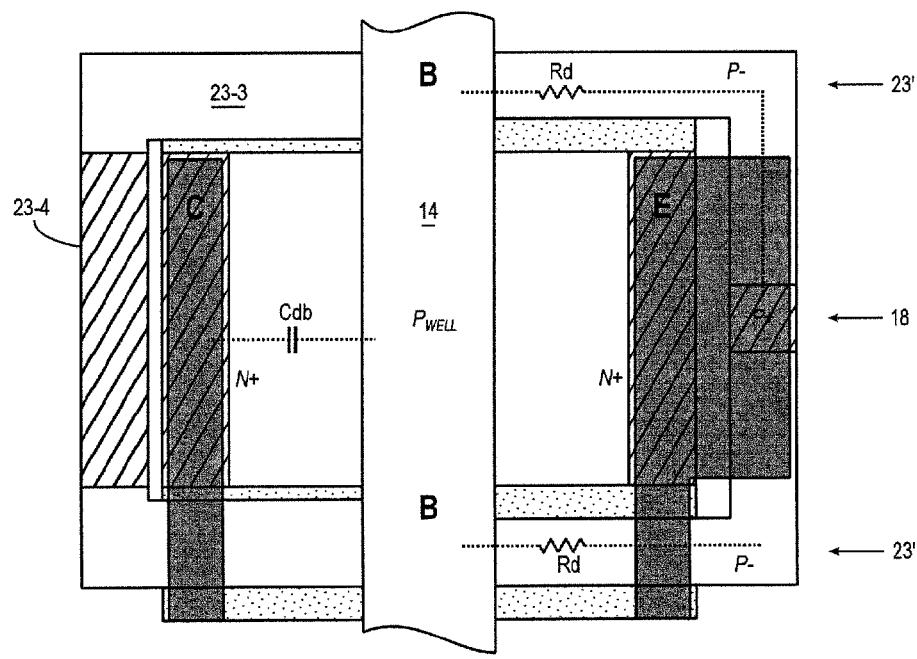
FIG. 7 is a schematic diagram of a top plan view of another embodiment of the protection device, according to the present disclosure.

FIG. 7 is a top view of an embodiment of a protection device that allows for increasing the capacitance value Cdb. The left portion of each contact structure 23' is "L" shaped, having a transverse arm 23-3 integral with the central zone 14, and a longitudinal arm 23-4 parallel to the left side face of the structure 18. The longitudinal arm 23-4 forms with the side face a capacitance between the collector C and the base B of the transistor, the capacitance being added to the collector-base junction capacitance Cdb. This capacitance may be increased by bringing the longitudinal arm 23-4 closer to the left side face and, as shown by raising the arm facing the raised edge of the left wing of the structure 18. The capacitance may be further increased by bringing the transverse arms 23-3 closer to the left wing, as shown.

Many variations and modifications of the embodiments described herein will be apparent to the skilled person. Although conductivity types suitable for the most common applications have been mentioned, the conductivity types may be swapped in other applications, in order to achieve a protection device based on a PNP transistor, for example. Although the described protection devices are designed to be integrated in a waveguide, they may also be made in dummy waveguide sections, not conveying any optical wave, arranged in the vicinity of the components to protect of a real waveguide.

That which is claimed is:

1. An electrostatic discharge (ESD) protection device for an electro-optical device, the ESD protection device comprising:
   an optical waveguide segment being in semiconductor material and comprising
      a central zone of a first conductivity type, and
      first and second wings of a second conductivity type different from the first conductivity type and being adjacent said central zone;
   a first conduction terminal on said first wing and configured to define a first protection terminal;
   a second conduction terminal on said second wing and configured to define a second protection terminal; and
   a resistive contact structure of the first conductivity type and having
      an arm integral with said central zone extending transverse to a longitudinal optical axis of said central zone, and
      an end in ohmic contact with said first conduction terminal, said resistive contact structure being electrically isolated from said first wing.

2. The ESD protection device according to claim 1 wherein said first and second wings are integral with said central zone.

3. The ESD protection device according to claim 1 further comprising a longitudinal electrically conductive track; and wherein said arm has a distal end coupled to said first conduction terminal via said longitudinal electrically conductive track.

4. The ESD protection device according to claim 1 further comprising an electrically conductive track; and wherein said resistive contact structure is L-shaped and comprises a longitudinal arm having an end coupled to said first conduction terminal via said electrically conductive track.

5. The ESD protection device according to claim 1 further comprising first and second contact structures symmetrical to a transverse axis of said first wing.

6. The ESD protection device according to claim 1 further comprising a capacitive structure of the first conductivity type having a first arm integral with said central zone and a second arm parallel to a face of said second wing.

7. An optical waveguide in a semiconductor material, the optical waveguide comprising:
   a central zone of a first conductivity type and configured to convey an optical wave;
   first and second wings of a second conductivity type different from the first conductivity type and being adjacent said central zone;
   an electro-optical component comprising a control terminal on each wing;
   an electrostatic discharge (ESD) protection device comprising
      a first conduction terminal on said first wing and configured to define a first protection terminal,
      a second conduction terminal on said second wing and configured to define a second protection terminal, and
      a resistive contact structure of the first conductivity type and having
         an arm integral with said central zone extending transverse to a longitudinal optical axis of said central zone, and
         an end in ohmic contact with said first conduction terminal, said resistive contact structure being electrically isolated from said first wing; and
   longitudinal electrically conductive tracks coupling the control terminals of said electro-optical component respectively to said first conduction and second conduction terminals of said ESD protection device.

8. The optical waveguide according to claim 7 wherein said first and second wings are integral with said central zone.

9. The optical waveguide according to claim 7 wherein said ESD protection device comprises a longitudinal electrically conductive track; and wherein said arm has a distal end coupled to said first conduction terminal via said longitudinal electrically conductive track.

10. The optical waveguide according to claim 7 wherein said ESD protection device comprises an electrically conductive track; and wherein said resistive contact structure is L-shaped and comprises a longitudinal arm having an end coupled to said first conduction terminal via said electrically conductive track.

11. The optical waveguide according to claim 7 wherein said ESD protection device comprises first and second contact structures symmetrical to a transverse axis of said first wing.

12. The optical waveguide according to claim 7 wherein said ESD protection device comprises a capacitive structure of the first conductivity type having a first arm integral with said central zone and a second arm parallel to a face of said second wing.

13. A method for making an electrostatic discharge (ESD) protection device for an electro-optical device, the method comprising:
   forming an optical waveguide segment being in semiconductor material and comprising
      a central zone of a first conductivity type, and
      first and second wings of a second conductivity type different from the first conductivity type and being adjacent the central zone;
   forming a first conduction terminal on the first wing for defining a first protection terminal;
   forming a second conduction terminal on the second wing for defining a second protection terminal; and
   forming a resistive contact structure of the first conductivity type and having
      an arm integral with the central zone extending transverse to a longitudinal optical axis of said central zone, and
      an end in ohmic contact with the first conduction terminal, the resistive contact structure being electrically isolated from the first wing.

14. The method according to claim 13 wherein the first and second wings are integral with the central zone.

15. The method according to claim 13 wherein the arm has a distal end coupled to the first conduction terminal via a longitudinal electrically conductive track.

16. The method according to claim 13 wherein the resistive contact structure is L-shaped and comprises a longitudinal arm having an end coupled to the first conduction terminal via an electrically conductive track.

17. The method according to claim 13 further comprising forming first and second contact structures symmetrical to a transverse axis of the first wing.

18. The method according to claim 13 further comprising forming a capacitive structure of the first conductivity type having a first arm integral with the central zone and a second arm parallel to a face of the second wing.

19. The ESD protection device according to claim 1 wherein said first and second conduction terminals each comprises an ohmic contact.

20. The optical waveguide according to claim 7 wherein said first and second conduction terminals each comprises an ohmic contact.

* * * * *